(12) United States Patent
Meyers

(10) Patent No.: US 8,414,308 B1
(45) Date of Patent: Apr. 9, 2013

(54) ELECTRICAL CONNECTORS FOR BUILDING INTEGRABLE PHOTOVOLTAIC MODULES

(75) Inventor: Michael C. Meyers, San Jose, CA (US)

(73) Assignee: Miasole, Santa Clara, CA (US)

( * ) Notice: Subject to any disclaimer, the term of this patent is extended or adjusted under 35 U.S.C. 154(b) by 214 days.

(21) Appl. No.: 13/042,317

(22) Filed: Mar. 7, 2011

(51) Int. Cl.
*H01R 12/00* (2006.01)

(52) U.S. Cl. ......................................................... 439/67

(58) Field of Classification Search .................... 439/67, 439/492; 136/44
See application file for complete search history.

(56) References Cited

U.S. PATENT DOCUMENTS

| 8,147,274 | B2* | 4/2012 | Mizukami | 439/607.07 |
| 8,192,207 | B2* | 6/2012 | Iida | 439/67 |

* cited by examiner

*Primary Examiner* — Phuong Dinh
(74) *Attorney, Agent, or Firm* — Weaver Austin Villeneuve & Sampson LLP

(57) ABSTRACT

Provided are novel building integrable photovoltaic (BIP) modules having flexible connectors and methods of interconnecting thereof. According to various embodiments, a BIP module includes one or more photovoltaic cells positioned on a support sheet and two or more electrical connectors attached to the support sheet. At least two conductive elements of these connectors are electrically coupled to the photovoltaic cells. One connector includes a connector body and an arm, which allows the connector body to move with respect to the support sheet at least in a direction perpendicular to the support sheet. This flexibility may be used to electrically interconnect modules as well as other purposes. Another connector also has a connector body, which may be flexibly or rigidly attached to the same support sheet. Positioning two connectors on opposite edges of the module allows forming a row of electrically interconnected modules.

20 Claims, 10 Drawing Sheets

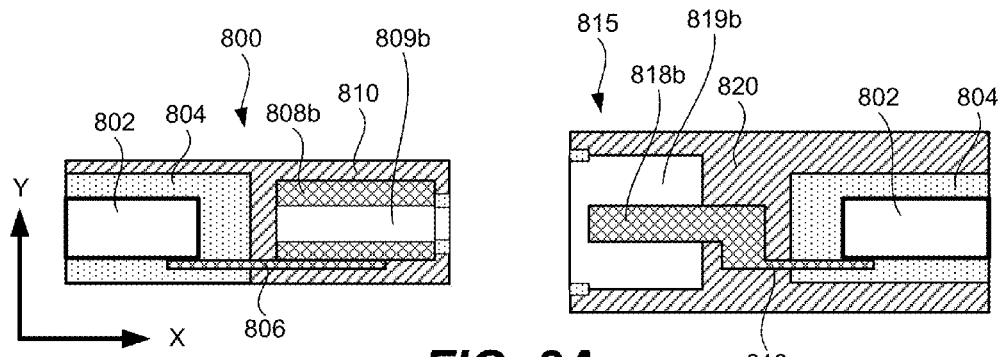
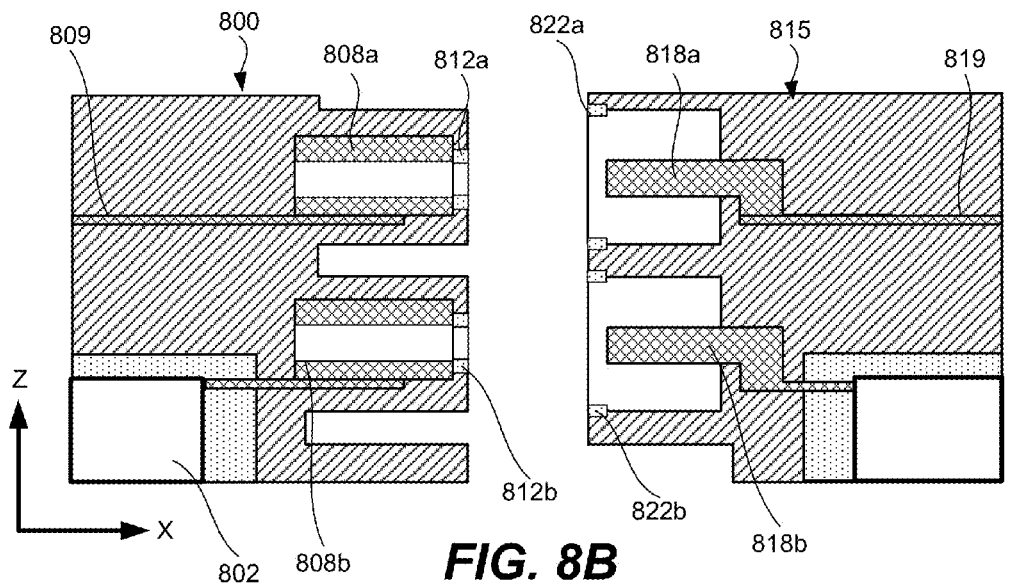
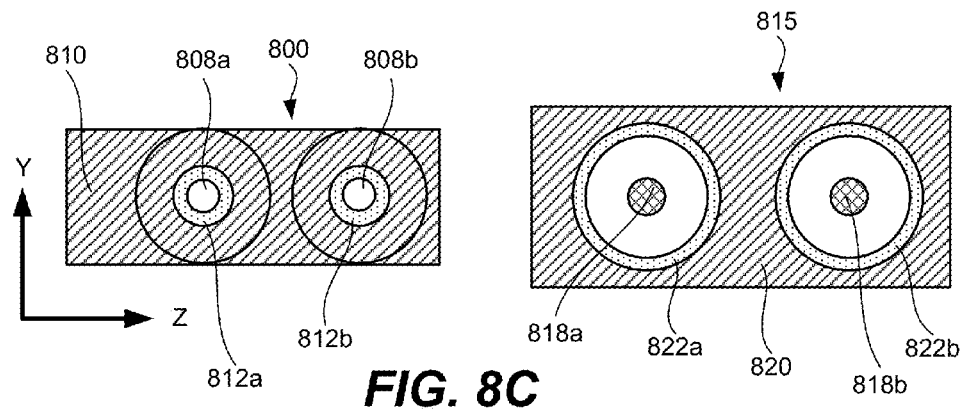

ELECTRICAL CONNECTORS FOR BUILDING INTEGRABLE PHOTOVOLTAIC MODULES

BACKGROUND

Photovoltaic cells are widely used for electricity generation with one or more photovoltaic cells typically sealed within and interconnected in a module. Multiple modules may be arranged into photovoltaic arrays used to convert solar energy into electricity by the photovoltaic effect. Arrays can be installed on building rooftops and are used to provide electricity to the buildings and to the general grid.

SUMMARY

Provided are novel building integrable photovoltaic (BIP) modules having flexible connectors and methods of their interconnection. According to various embodiments, a BIP module includes one or more photovoltaic cells positioned on a support sheet and two or more electrical connectors attached to the support sheet. At least two conductive elements of these connectors are electrically coupled to the photovoltaic cells. One connector includes a connector body and an arm, which allows the connector body to move with respect to the support sheet at least in a direction perpendicular to the support sheet. This flexibility may be used to electrically interconnect modules as well as for other purposes. Another connector also has a connector body, which may be flexibly or rigidly attached to the same support sheet. Positioning two connectors on opposite edges of the module allows forming a row of electrically interconnected modules.

In certain embodiments, a BIP module includes one or more photovoltaic cells positioned on a support sheet as well as a first connector and a second connector attached to the sheet. The sheet is defined by a planar surface. The first connector includes a connector body and an arm, which mechanically connects the body to the sheet and allows the body to move with respect to the sheet at least in a direction perpendicular to the planar surface. This flexibility of the first connector may be used to form an electrical connection with an adjacent module. The body also includes one or more conductive elements, one of which is electrically coupled to the photovoltaic cells. The second connector also includes a connector body (i.e., a second connector body) attached to the support sheet. The second connector body includes one or more conductive elements, one of which is electrically coupled to the photovoltaic cells. The second connector is configured to form an electrical connection with yet another adjacent module. In certain embodiments, the second connector is also movable with respect to the support sheet and may have an arm connecting the second connector body to the support sheet.

An arm of the connector may be an extension of the support sheet. For example, the support sheet may have a partial cut defining an arm and separating it from the rest of the support sheet. In the same or other embodiments, an arm may be made from a flexible material and contain one or more flexible conductive pathways. This configuration allows the arm to bend along its length in a direction perpendicular to the support sheet and/or other directions. An arm may be made formed as a thin strip of a polymer material with one or more metal bus bars extending within and surrounded by the polymer material. In the same or other embodiments, an arm may include a pivoting axis, for example, at the interface with the support sheet.

In certain embodiments, an arm is sufficiently flexible to allow the connector body to move at least about 1 millimeter with respect to the support sheet in a direction parallel to a length of the arm. In the same or other embodiments, flexibility of the arm allows the connector body to move at least about 1 millimeter with respect to the support sheet in a direction that is perpendicular to the arm's length and at the same time parallel to the support sheet. One or both connectors may have arms with such flexibility. If two arms of adjacent interconnected modules have such flexibility, then one module may move with respect to the other module twice the distance listed above. Arms' flexibilities and movements do not interfere with the electrical connection between the modules.

A connector body may be made from one or more of rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used.

Some materials described above and elsewhere in this document may include engineered polymers, which are specifically formulated to meet certain requirements specific for photovoltaic applications. For example, certain hybrid block co-polymers may be used.

In certain embodiments, a connector body includes a cavity configured to fit snugly over another connector body of the adjacent module. This cavity may have an opening facing towards a planar surface of the support sheet during installation or, more specifically, towards another connector body and/or a building structure. In certain embodiments, the cavity has a conductive pin positioned within the cavity and acting as a conductive element.

In certain embodiments, a connector body includes one or more interlocking features. The interlocking features are configured to keep one connector body connected to another connector body after installation. In the same or other embodiments, a connector body includes one or more sealing features. A connector body may include one or more conductive elements that are not electrically connected to the photovoltaic cells of the module. For example, a module may have bus bar extending throughout the module without making any direct electrical connections to the cells. In certain embodiments, one or both connectors are positioned in a moisture flap area of the module.

Provided also is a method for installing a photovoltaic array. The method may involve providing first and second BIP modules and positioning a connector body of one module (e.g., the first module) over a connector body of the other module (e.g., the second module) to form an electrical connection between the modules' respective conductive elements. The first module may be positioned on a building structure and even attached to the building structure, for example, by nailing its support sheet to the structure. This module includes a first connector having a connector body and an arm, which mechanically connects the body to the support sheet such that the body is movable with respect to the support sheet at least in a direction perpendicular to its planar surface. The connector body includes one or more conductive elements, some of which may be electrically coupled to a set of photovoltaic cells of the module. The second module includes a connector also having a connector body attached to its own support sheet. This connector body similarly includes one or more conductive elements, some of which may be electrically coupled to a set of photovoltaic cells of the second module.

In certain embodiments, one module is movable with respect to another module in one or more direction parallel to a planar surface of either module without interfering with one or more electrical connections between the modules or, more specifically, between one or more conductive elements of the two modules. In the same or other embodiments, the process involves dispensing a sealing material and/or an adhesive material between the two connector bodies prior to positioning one connector body over the other one. The method may also include attaching support sheets of one or both modules to the building structure.

These and other aspects of the invention are described further below with reference to the figures.

BRIEF DESCRIPTION OF THE DRAWINGS

FIGS. 8A-8C are schematic cross-sectional views of two connectors configured for interconnection with each other in accordance with certain embodiments.

DETAILED DESCRIPTION OF EXAMPLE EMBODIMENTS

Figure 1:
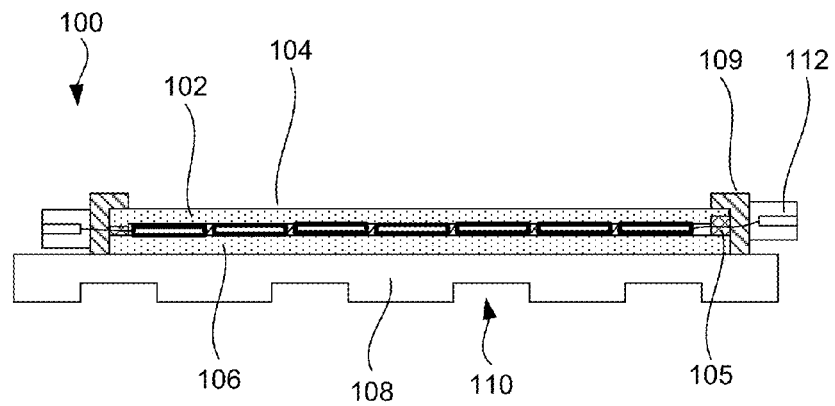
FIG. 1 is a schematic cross-sectional side view of a building integrable photovoltaic (BIP) module in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Building-integrable photovoltaic (BIP) modules are defined as specially configured photovoltaic modules that are used for integration into building structures in various parts of buildings, such as rooftops, skylights, or facades. In certain examples, BIP modules replace conventional building materials, such as asphalt shingles. Unlike traditional photovoltaic systems, BIP modules often do not require separate mounting hardware. As such, installed BIP modules provide substantial savings over more traditional systems in terms of building materials and labor costs. For example, a substantial part of traditional asphalt roof shingles may be replaced by "photovoltaic shingles." In certain embodiments, photovoltaic shingles are installed on the same base roof structures as the asphalt shingles. In fact, a rooftop may be covered by a combination of the asphalt and photovoltaic shingles. In certain embodiments, RIP modules are shaped like one or a collection of asphalt shingles. BIP modules may look and act much like the asphalt shingles while producing electricity in addition to protecting the underlying building structures from the environment. In certain embodiments, BIP modules may be about 14 (e.g., 13.25) inches by about 40 (e.g., 39.375) inches in size and may be stapled directly to the roof deck through water barrier roofing cloth, for example. Generally, only a portion of the photovoltaic shingle is exposed, while the remaining portion is covered by other shingles. The exposed portion is referred to as the "shingle exposure", while the covered portion is referred to as the "flap." For example, the shingle exposure of a 13.25 inch by 39.375 inch shingle may be only about 5 inches wide or, in some embodiments, about 5.625 inches wide. The length of the shingle exposure in some of these embodiments may be 36 inches or about 39.375 inches (if side skirts are not used, for example). Other dimensions of photovoltaic shingles may be used as well.

During installation, BIP modules need to be electrically interconnected with respect to each other and/or a building structure. This is typically a very labor intensive operation, which often requires a separate installation professional and multiple holes to be made through the building structure for some traditional BIP module designs. For example, electrical connections are conventionally made on the inside of the building structure and wires from each module are fed through the structure through individual holes. Novel BIP modules and connectors described in this document substantially simplify the installation process and provide robust electrical connections without a need for holes through the building structure that may present a risk to its integrity. A module includes one or more photovoltaic cells positioned on a support sheet and two or more electrical connectors attached to the support sheet. At least two conductive elements of these connectors are electrically coupled to the photovoltaic cells. One connector includes a connector body and an arm, which allows the connector body to move with respect to the support sheet at least in a direction perpendicular to the support sheet. This flexibility may be used to electrically interconnect modules as well as other purposes. Another connector also has a connector body, which may be flexibly or rigidly attached to the same support sheet. Positioning two connectors on opposite edges of the module allows forming a row of electrically interconnected modules.

To provide a better understanding of various features of BIP modules and methods of integrating connectors with photovoltaic inserts during module fabrication, some examples of BIP modules will now be briefly described. FIG. 1 is a schematic cross-sectional end view (line 1—1 in FIG. 2 indicates the position of this cross-section) of a BIP module 100 in accordance with certain embodiments. RIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 $g/m^2/day$. In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sealing sheet 106. The attachment may be provided by a support edge 109, which, in certain embodiments, is a part of support sheet 108. Support sheets may be made, for example, from rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

RIP module 100 has one or more electrical connectors 112 for electrically connecting BIP module 100 to other BIP modules and array components, such as an inverter and/or a battery pack. In certain embodiments, RIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

Figure 2:
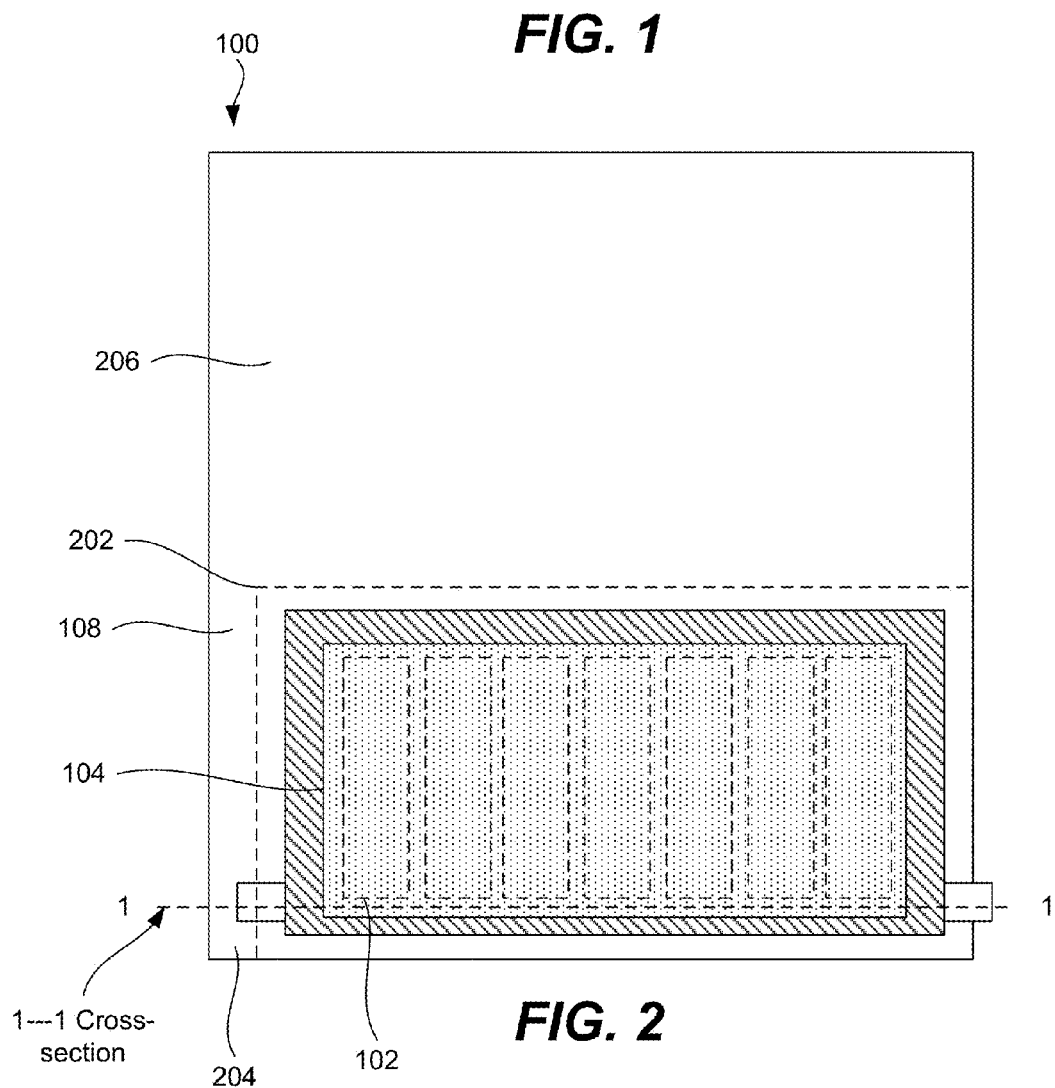
FIG. 2 is a schematic top view of a BIP module in accordance with certain embodiments.

FIG. 2 is a schematic top view of BIP module 100 in accordance with certain embodiments. Support sheet 108 is shown to have a side skirt 204 and a top flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of BIP module 100 that does not extend under other BIP modules or similar building materials (e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

Figure 3:
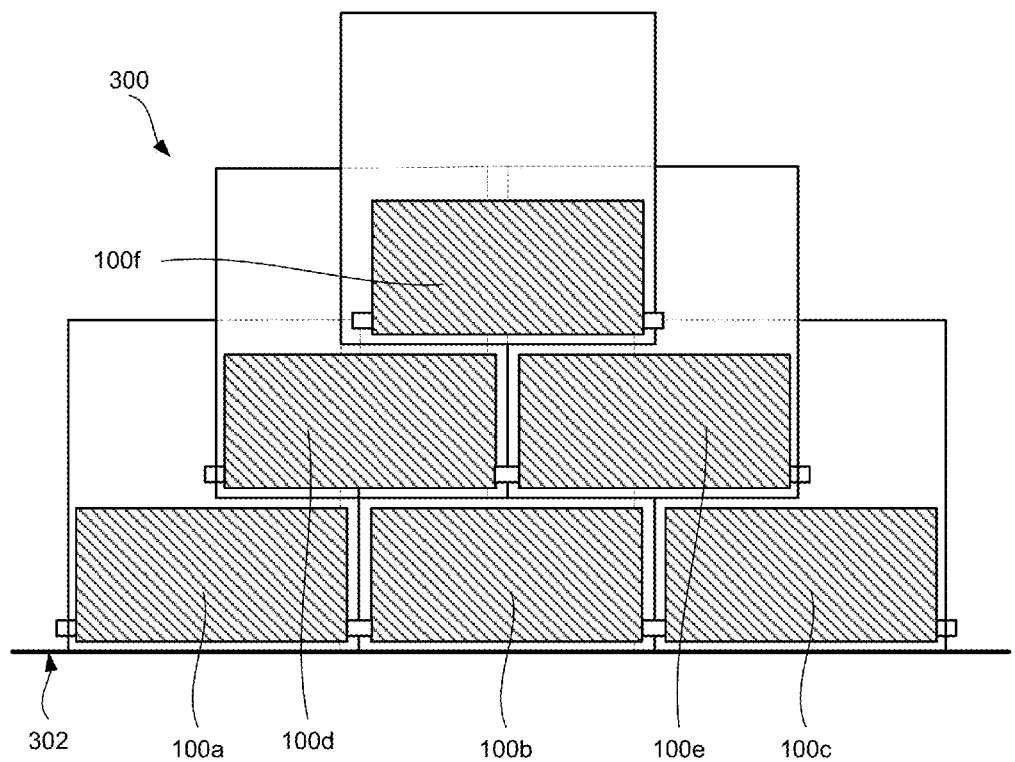
FIG. 3 illustrates a subset of a photovoltaic array that includes six RIP modules in accordance with certain embodiments.

FIG. 3 illustrates a photovoltaic array 300 or, more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another RIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
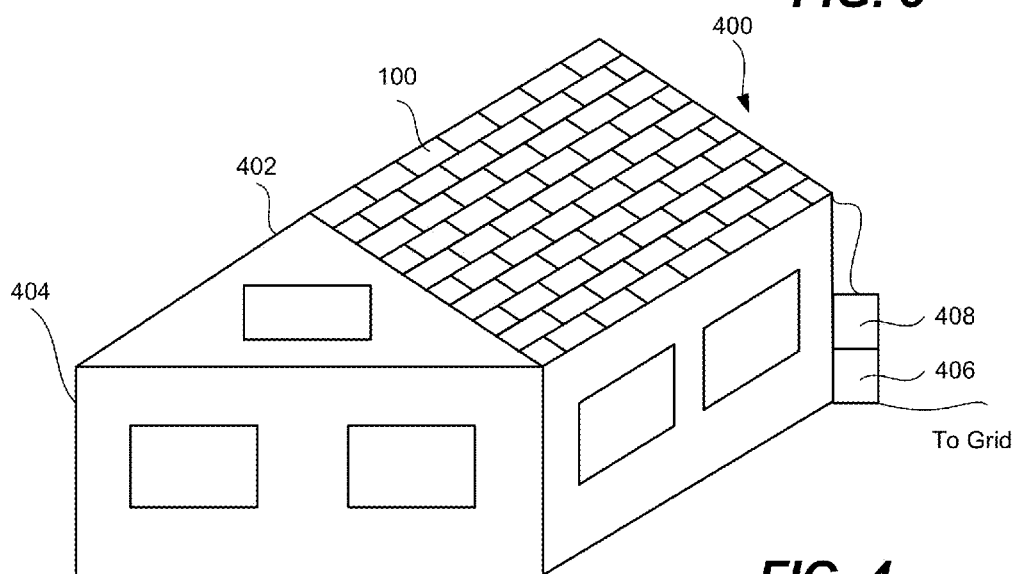
FIG. 4 is a schematic illustration of a photovoltaic array installed on a rooftop of a building structure in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple RIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIP modules 100 may also be used in combination with other roofing materials (e.g., asphalt shingles) and cover only a portion of rooftop. Generally, RIP modules 100 may be used on steep sloped to low slope rooftops. For example, the rooftops may have a slope of at least about 2.5-to-12 or, in many embodiments, at least about 3-to-U.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by RIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240-Gridtec 10, available from Trace Technologies in Livermore, Calif.) and a string inverter (e.g. Sunny Boy RTM.2500 available from SMA America in Grass Valley, Calif.). In certain embodiments, BIP modules may include integrated inverters, i.e., "on module" inverters. These inverters may be used in addition to or instead of external inverter 406. Battery pack 408 is used to balance electric power output and consumption.

Figure 5:
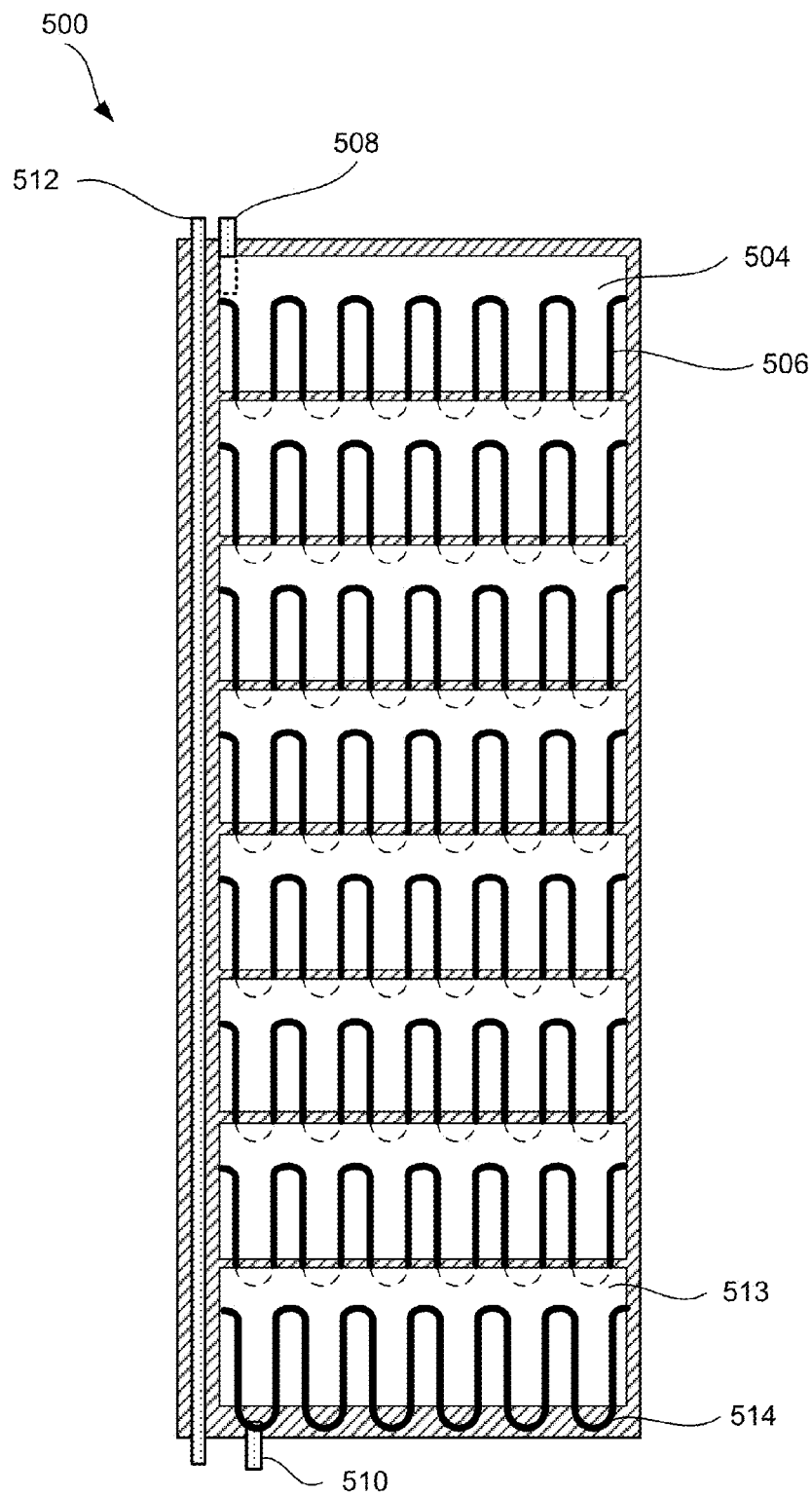
FIG. 5 is a schematic representation of a photovoltaic module having electrically interconnected photovoltaic cells in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
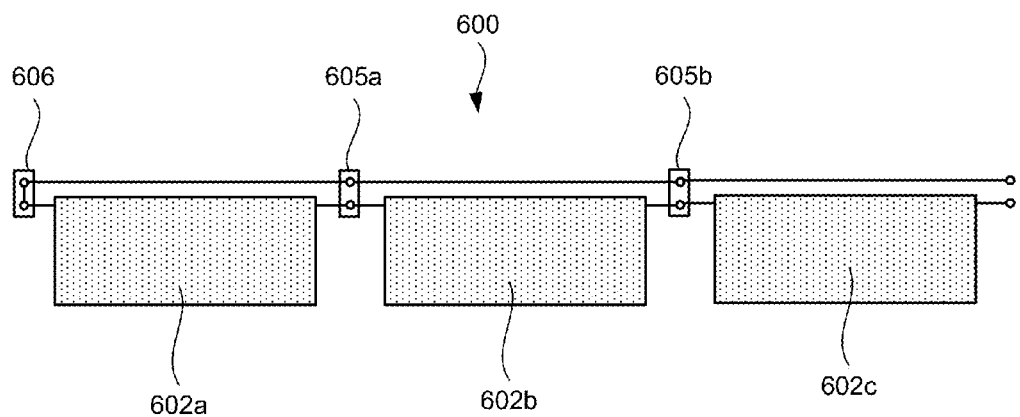
FIG. 6 is a schematic electrical diagram of a photovoltaic array having three BIP modules interconnected in series in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) be used for connecting module connectors of two adjacent modules.

Module connector 606 may be a special separate connector component that is connected to one module only. It may be used to electrically interconnect two or more conductive elements of the same module connector.

Figure 7:
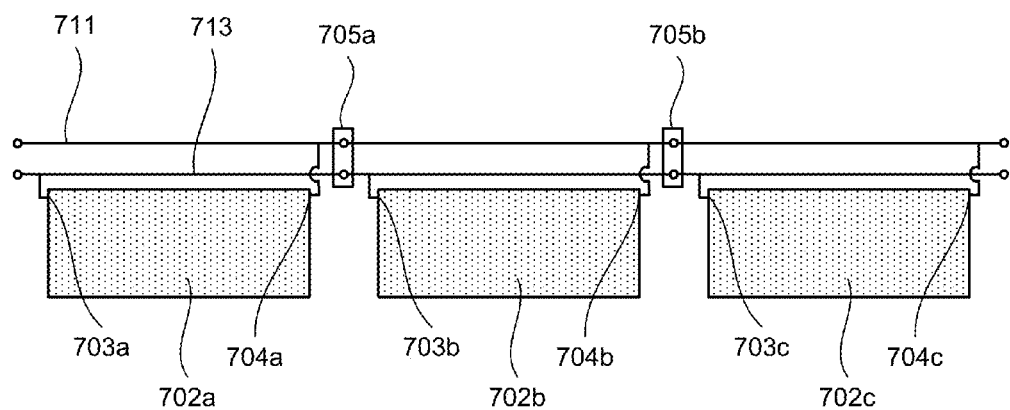
FIG. 7 is a schematic electrical diagram of another photovoltaic array having three BIP modules interconnected in parallel in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer can not accidently touch conductive elements or any other electrical elements of these connectors during handling of the BIP module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of sockets 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive element cavities 808a and 808b.

Figure 9:
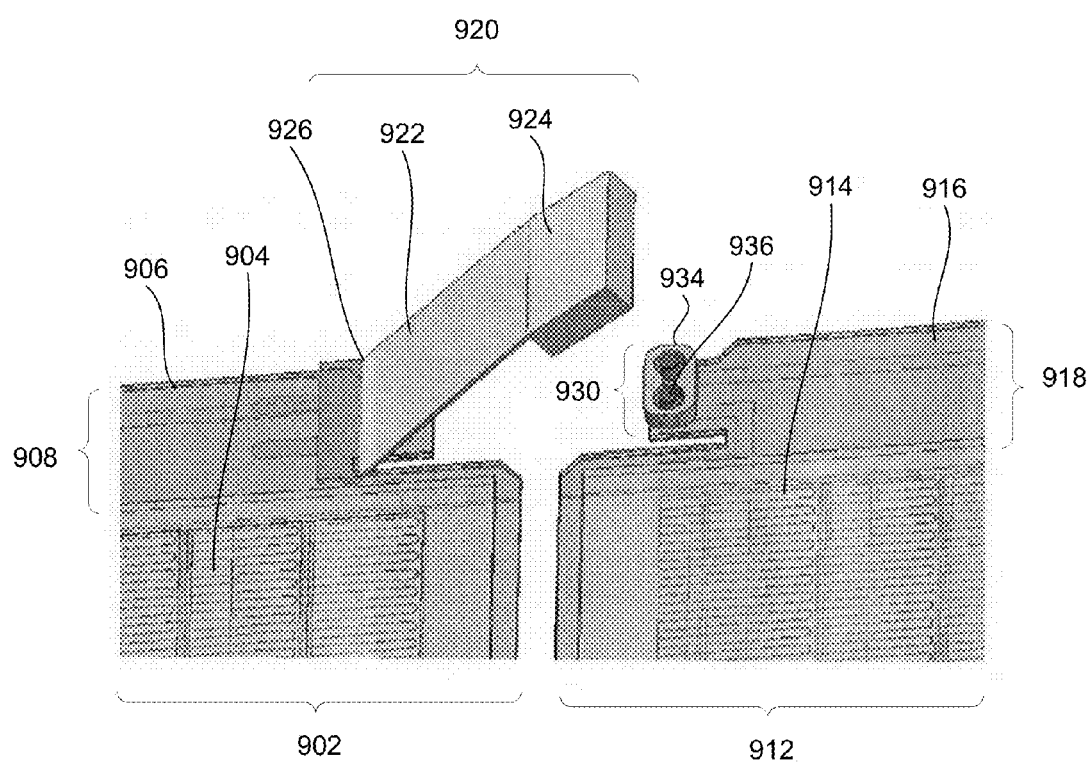
FIG. 9 is a schematic representation of two building integrable photovoltaic (BIP) modules prior to making an electrical connection between these modules in accordance with certain embodiments.

FIG. 9 is a schematic representation of two building integrable photovoltaic (BIP) modules 902 and 912 prior to making one or more electrical connections between these modules in accordance with certain embodiments. Module 902 has one or more photovoltaic cells 904 positioned on a support sheet 906. When multiple photovoltaic cells are provided, the cells are typically interconnected in series or in parallel. Various examples of photovoltaic cells and interconnecting techniques are described above. In specific embodiments, each module has at least ten Copper indium gallium (di)selenide (CIGS) cells interconnected in series.

Support sheet 906 of module 902 has a planar surface, which is defined as a front surface of support sheet 906. Support sheet 906 may be made from various materials, such as polyethylene, polypropylene, thermoplastic rubber, thermoplastic elastomer, and ethylene propylene diene monomer (EPDM). In certain embodiments, support sheet 906 is formed during injection molding and formation of an overmolding around photovoltaic cells 904. In other embodiments, a support sheet is apart of a back sealing sheet and/or a front sealing sheet of the module. These two sealing sheets are used for environmental and electrical protection as well as for mechanical support of cells 904. One or both sealing sheets may be made from rigid and/or flexible materials. For example, in certain embodiments both front and back sealing sheets are made from rigid glass sheets. In another example, a front sheet is made from a rigid glass sheet, while a back sheet is made from a flexible sheet. In yet another example, both sealing sheets are flexible. Examples of rigid materials include window glass, plate glass, silicate glass, low iron glass, tempered glass, tempered CeO-free glass, float glass, colored glass, and the like. In certain embodiments, one or both of the front and back sheets are made from or include polymer materials. Examples of suitable polymer materials, which can be rigid or flexible, include poly(ethylene terephthalate), polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly (urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymer, and the like. A thickness of the sealing sheet may be between about 1 millimeter and about 15 millimeters or, more particularly, between about 2.5 millimeters and about 10 millimeters, for example, about 3 millimeters or about 4 millimeters.

Module 902 has a connector 920 that includes a connector body 924 and an arm 922. Arm 922 supports connector body 924 such that connector body 924 is movable with respect to support sheet 906. This flexibility allows connector 920 to mechanically and electrically interconnect with another connector, such as connector 930 of module 912. More specifically, this flexibility allows connector body 924 to move in a direction substantially perpendicular to the planar surface of support sheet 906, i.e., in the up-and-down direction, with respect to support sheet 906. Connector body 924 and/or connector arm 924 may be made of one or more of rigid materials some examples of which are described above.

In certain embodiments, a connector arm is a part of the support sheet or an extension of the support sheet. For example, the support sheet may have a partial cut defining an arm and separating it from the rest of the support sheet. In the same or other embodiments, a connector arm and other connector components may be a part of a moisture flap of the module. As shown in FIG. 9, module 902 has a moisture flap 908 extending on one side of photovoltaic cells 904. Module 912 is shown to have a similar moisture flap 918 extending along the same side of cells 914. Connectors 920 and 930 are positioned in areas of respective moisture flaps 908 and 918. Connectors 920 and 930 may be sufficiently thin to fit under another module extending over moisture flaps 908 and 918 after installation. In certain embodiments, connectors are configured to fit into a ventilation channel of the other module.

Module 912 has one or more photovoltaic cells 914 positioned on a support sheet 916. Module 912 also has a connector 930 including a connector body 934 attached to support sheet 916. Connector body 934 includes one or more conductive elements 936. More specifically, FIG. 9 illustrates two pin-type conductive elements 936 positioned in a cavity of connector body 934. At least one of conductive elements 936 may be electrically coupled to photovoltaic cells 914. Connector 930 is configured to form one or more electrical connections with connector 920 defined by the respective conductive elements of the connectors. Overall, modules 902 and 912 may have similar designs that allow forming a row of interconnected modules. Specifically, module 902 may have connector 920 on one edge and a connector similar to connector 930 on the other opposite edge. Using these two connectors, module 902 may form electrical connections with two other modules.

As mentioned above, arm 922 is used to flexibly support connector body 924 with respect to support sheet 906. In certain embodiments, arm 922 comprises a pivoting axis 926 that allows a portion of arm 922 or entire arm 922 to move with respect to support sheet 906. Pivoting axis 926 may be positioned at the interface with support sheet 906 as shown in FIG. 9, which allows entire arm 922 to pivot with respect to support sheet 906. In other embodiments, a pivoting axis may be positioned at some point along the arm's length, which may divide the arm into a stationary portion and a moving portion. A pivoting axis may be substantially perpendicular to the length of the arm. A pivoting axis may be formed by thinning one or more arm components, providing partial cuts, or otherwise making a portion of the connector more flexible than other portions.

Figure 10A:
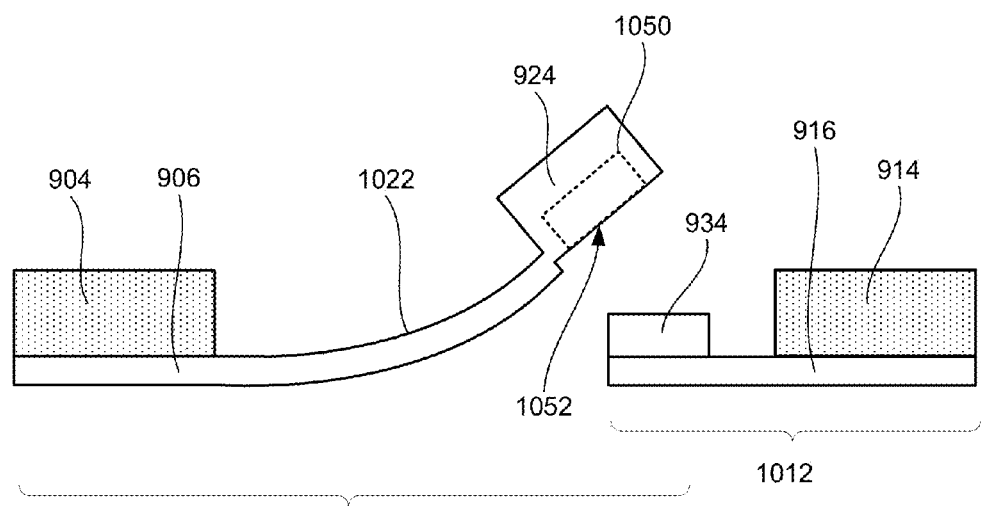
FIG. 10A is another schematic representation of two other BIP modules prior to making an electrical connection between these modules in accordance with certain embodiments.
Figure 10B:
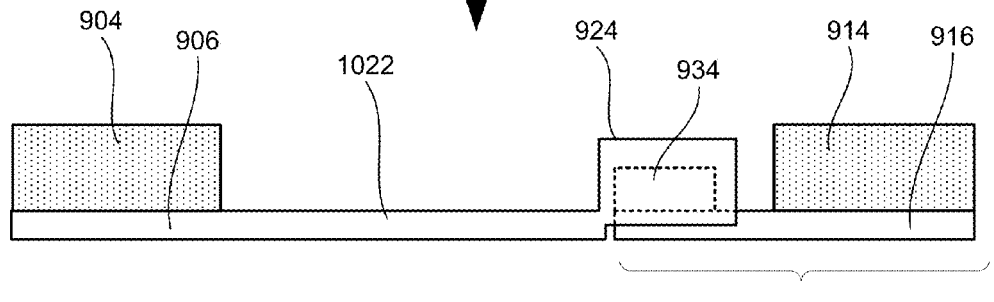
FIG. 10B is a schematic representation of two interconnected BIP modules in accordance with certain embodiments.

In other embodiments, an arm may be made from a flexible material and include one or more flexible conductive pathways that allows the arm to bend along its length during installation. FIG. 10A is a schematic illustration of two photovoltaic modules 1002 and 1012 prior to their interconnection in accordance with certain embodiments. Modules 1002 and 1012 may have support sheets 906 and 916 and photovoltaic cells 904 and 914 similar to the ones described above in the context of FIG. 9. Connector bodies 924 and 934 may be also similar. However, a connector arm 1022 of module 1002 is configured to bend in a direction away from the planar surface of module 1002. While bending, arm 1022 may transform from a straight rectangular shape to an arc similar to the one shown in FIG. 10A. This bending allows for connector body 934 of module 1012 to be positioned under connector body 924 of module 1002. Connector body 924 then pushed towards connector body 934 to form electrical connections between their respective conductive elements as shown in FIG. 10B. In certain embodiments, an arm has a pivoting axis and is still flexible along its length.

A connector body may have a cavity configured to fit snugly over a connector body of an adjacent module. For example, FIGS. 10A and 10B illustrate connector 924 having a cavity 1050 to fit around connector 934. Cavity 1050 has an opening 1052 facing downwards, i.e., towards a planar surface of support sheet 906 or more specifically towards a building structure, in the installed position shown in FIG. 10B. This design helps to prevent moisture from getting into a contact area between two connector bodies 924 and 934. One or more conductive elements of connector body 924 may be shaped as pins and extend within cavity 1050. Opening 1052 of cavity 1050 may be sufficiently small to enhance product safety by preventing accidental contact with the conductive elements. In certain embodiments, such openings may be provided on other corresponding connectors to allow for "touch-safe" designs.

Figure 11:
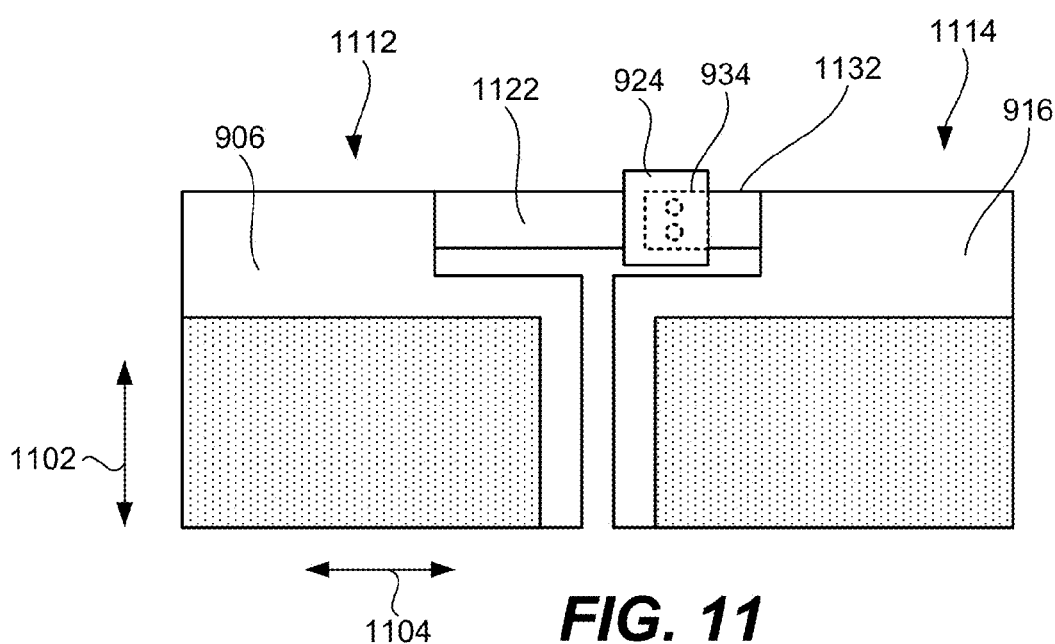
FIG. 11 is a schematic top view of two interconnected BIP modules illustrating flexibility of their connectors that allows one module to move with respect to the other module in accordance with certain embodiments.

In addition to flexibility in the up-and-down direction described above in the context of FIGS. 9, 10A and 10B, one or both connectors may have flexibility in other directions, for example, in various directions parallel to the planar surface. FIG. 11 is a schematic top view of two interconnected BIP modules 1112 and 1114 in accordance with certain embodiments. Module 1112 may move with respect to module 1114 in a direction 1102 and/or a direction 1104 while retaining all electrical connections between the two modules. Flexibility along these directions may be needed during installation to interconnect two slightly misaligned BIP modules and/or during operation to accommodate slight movements caused by thermal expansion and other reasons. In certain embodiments, the flexibility provided by the two connectors is at least about 1 millimeter in direction 1102 and/or at least about 1 millimeter in direction 1104. More specifically, the flexibility between two modules 1112 and 1114 is at least about 2 millimeters in direction 1102 or, more specifically, at least about 5 millimeters, or even at least about 20 millimeters. In the same or other embodiments, the flexibility between two modules 1112 and 1114 is at least about 2 millimeters in direction 1104 is at least about 2 millimeters or, more specifically, at least about 5 millimeters, or even at least about 20 millimeters.

This flexibility may be provided by one or both connector arms 1122 and 1132. Arm 1122 is used to attach connector body 924 to support sheet 906. Likewise, arm 1132 is used to attach connector body 934 to support sheet 916. In certain embodiments, a two-module interconnection has only one flexible arm or one arm at all. For example, connector 934 may be attached directly to support sheet 916 without an arm or any other extension between connector 934 and support sheet 916.

In certain embodiments, arm 1122 and/or arm 1132 are sufficiently flexible to allow their respective connector bodies elements 924 and 934) to move at least about 1 millimeter with respect to their respective support sheets (elements 906 and 916) in direction 1102 and/or direction 1104 or, more specifically, at least about 2 millimeters, about 5 millimeters, or even at least about 20 millimeters. Direction 1104 may be also defined as a direction parallel to a length of a connector arm. Direction 1102 may be defined as a direction perpendicular to a length of an arm and parallel to a planar surface of the support sheet.

In certain embodiments, a connector or, more specifically, a connector body has one or more interlocking features for interlocking with another connector body of an adjacent module during installation. For example, a connector body has one or more protrusions extending into its cavity. When another connector body is inserted into this cavity, the protrusion may be first compressed but then extended behind other protrusions or edges effectively preventing this second connector body from sliding outside of the cavity. The interlocking features may be configured to require a tool for disconnection of the modules.

A connector body may also include a seal configured for protecting conductive elements of the connector from moisture. In certain embodiments, a seal is positioned inside the cavity and configured to form a mechanical contact with a top edge of another connector body inserted into the cavity during installation. The seal may be formed using an O-ring or other sealing components and materials, e.g., silicone sealant, butyl rubber inserts.

Figure 12:
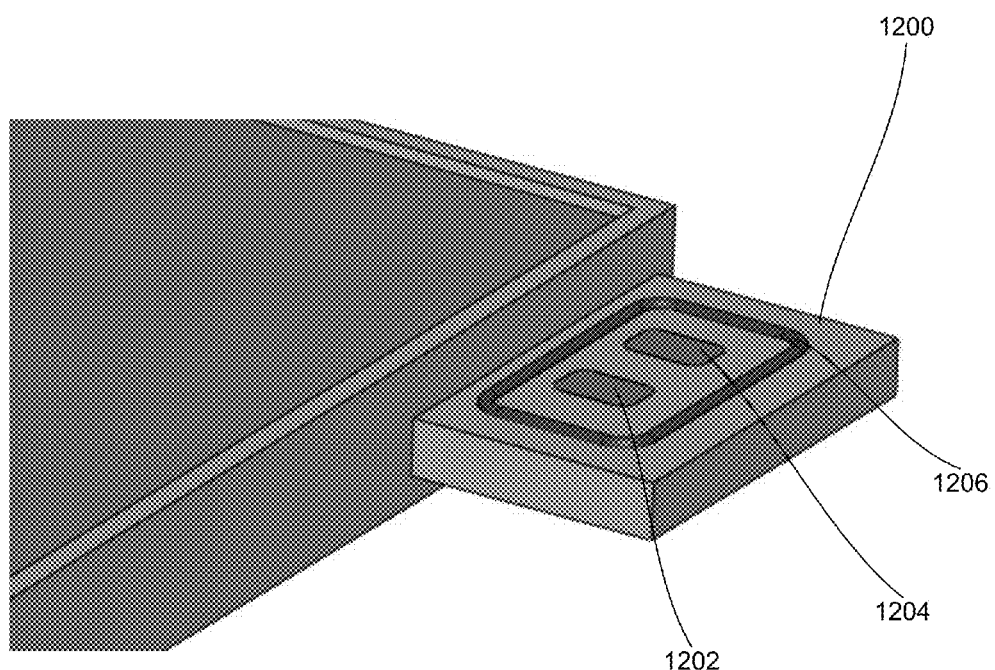
FIG. 12 illustrates an example of a connector with two flat conductive elements surrounded by a seal in accordance with certain embodiments.

In certain embodiments, connectors do not have a cavity-pin design as discussed above. Instead, an electrical connection may be established when two substantially flat surfaces contact each other. FIG. 12 illustrates an example of a connector 1200 with two flat conductive elements (contacts) 1202 and 1204 (facing upwards) surrounded by a seal 1206 in accordance with certain embodiments. The seal may be a rubber O-ring in a groove surrounding the contacts to conform the O-ring for engagement with a corresponding seal-forming surface on a counterpart connector element, for example. Connector 1200 may be used to establish two separate electrical connections with a similar connector that has conductive elements (facing downwards and towards conductive elements 1202 and 1204). Conductive elements 1202 and 1204 may be substantially flat or have some topography designed to increase a contact surface over the same projection boundary and/or to increase contact force at least in some areas. Examples of such surface topography features include multiple pin-type or rib-type elevations or recesses.

Installation Examples

Figure 13:
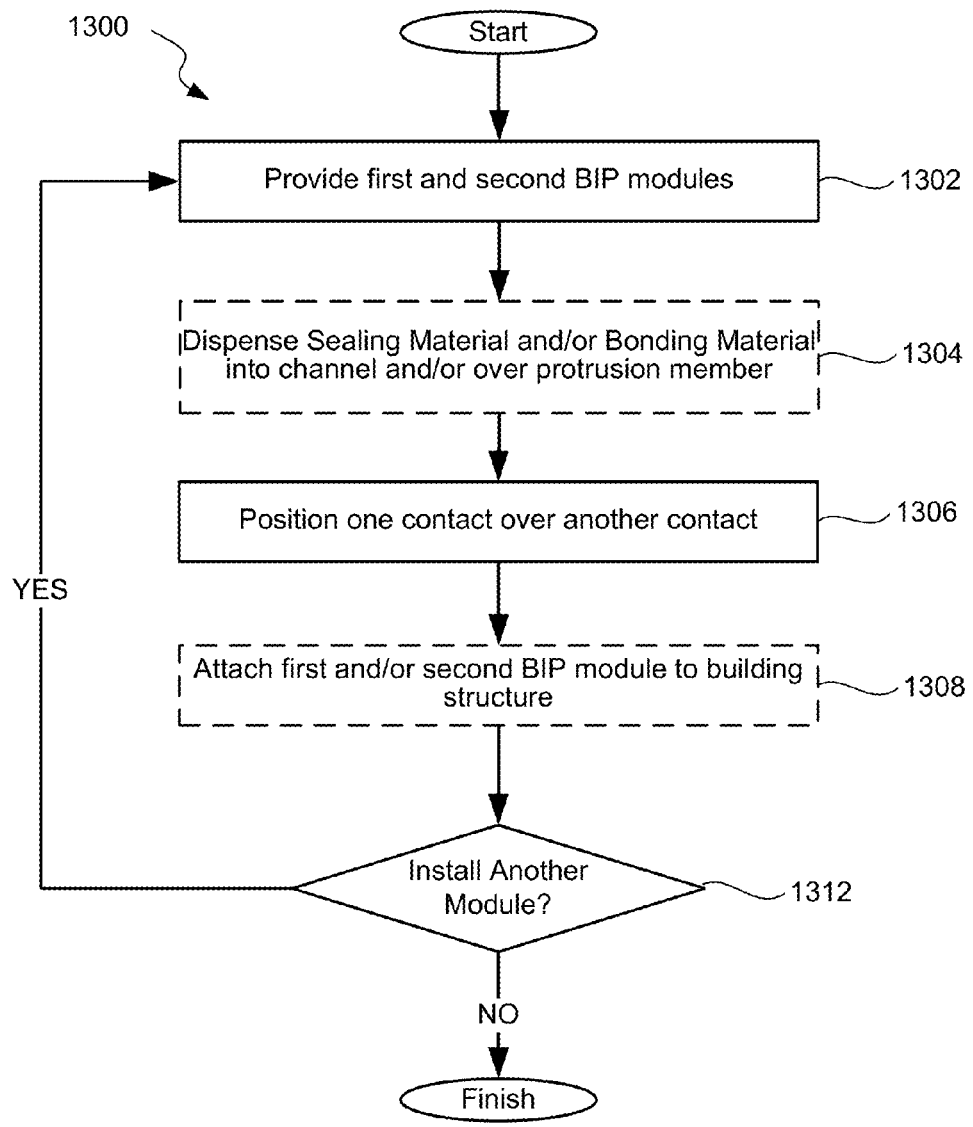
FIG. 13 is a flowchart corresponding to a process for installing an array of BIP modules in accordance with certain embodiments.

FIG. 13 is a flowchart corresponding to a process 1300 for installing an array of BIP modules in accordance with certain embodiments. Process 1300 may start with providing two BIP modules, i.e., a first module and a second module, in operation 1302. Various examples of BIP modules are described above. One or both modules may be attached to a building structure and/or electrically interconnected with one or more other BIP modules. In either case, the two modules are typically substantially aligned with respect to each other prior to operation 1306 such that their electrical connectors can establish a contact. As described above, the connectors may be sufficiently flexible in one or more directions substantially parallel to a planar surface of the modules to compensate for some misalignment or movement of the modules.

In certain embodiments, a sealing and/or bonding material (e.g., silicone based material) are dispensed over the protrusion member of the first module and/or into the channel of the second module during an optional operation 1304. Process 1300 may continue with positioning a connector of one module over another connector of the adjacent module in operation 1306. For example, a connector body of the first module may be fitted over a connector body of a second adjacent module. In certain embodiments, the first connector body has a cavity to receive the second connector body. When the two connectors are positioned into their respective installed positions, electrical connections between their respective conductive elements are established. The two connector bodies may also be interlocked during this operation.

Process 1300 may proceed with attaching one or both modules to the building structure in an optional operation 1310. For example, a top moisture flap of one or both modules may be nailed, screwed, glued, or otherwise attached to the building structure. Various operations of process 1300 may be repeated for one or more other BIP modules to form a row of mechanically and electrically interconnected BIP modules (decision block 1312)

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building integrable photovoltaic module comprising:
   one or more photovoltaic cells positioned on a support sheet having a planar surface;
   a first connector comprising a first connector body and a first arm, the first arm mechanically connecting the first connector body to the support sheet, the first connector body movable with respect to the support sheet at least in a direction perpendicular to the planar surface of the support sheet to form an electrical connection with an adjacent building integrable photovoltaic module, the first connector body comprising a first conductive element electrically coupled to the one or more photovoltaic cells; and
   a second connector comprising a second connector body attached to the support sheet, the second connector body comprising a second conductive element electrically coupled to the one or more photovoltaic cells, the second connector configured to form an electrical connection with a second adjacent building integrable photovoltaic module.

2. The building integrable photovoltaic module of claim 1, wherein the first arm comprises an extension of the support sheet.

3. The building integrable photovoltaic module of claim 1, wherein the first arm comprises a flexible material and a flexible conductive pathway that allow the first arm to bend along a length of the first arm in the direction perpendicular to the planar surface of the support sheet.

4. The building integrable photovoltaic module of claim 1, wherein the first arm comprising a pivoting axis at an interface with the support sheet.

5. The building integrable photovoltaic module of claim 1, wherein the first connector body and/or the first arm comprises one or more of the following materials: polyethylene terephthalate, polybutylene terephthalate, polyphenylene sulfide, polyamide, polycarbonate, and polypropylene.

6. The building integrable photovoltaic module of claim 1, wherein the first arm is sufficiently flexible to allow the first connector body to move at least about 1 millimeter with respect to the support sheet in a direction parallel to a length of the first arm, while maintaining the electrical connection between building integrable photovoltaic module and the adjacent building integrable photovoltaic module.

7. The building integrable photovoltaic module of claim 1, wherein the first arm is sufficiently flexible to allow the first connector body to move by at least about 1 millimeter with respect to the support sheet in a direction perpendicular to a length of the first arm and parallel to the planar surface, while maintaining the electrical connection between building integrable photovoltaic module and the adjacent building integrable photovoltaic module.

8. The building integrable photovoltaic module of claim 1, wherein the first connector body comprises a cavity configured to fit snugly over an adjacent second connector body of the second adjacent building integrable photovoltaic module.

9. The building integrable photovoltaic module of claim 8, wherein the cavity has an opening facing towards the planar surface during installation.

10. The building integrable photovoltaic module of claim 8, wherein the first conductive element comprises a pin positioned within the cavity and wherein the first connector body and/or the second connector body comprises one or more interlocking features.

11. The building integrable photovoltaic module of claim 1, wherein the first connector body and/or the second connector body comprises one or more sealing features.

12. The building integrable photovoltaic module of claim 1, wherein the first connector body further comprises an additional conductive element that is not electrically connected to the one or more photovoltaic cells.

13. The building integrable photovoltaic module of claim 1, wherein the first connector and the second connector are parts of a moisture flap extending along a side of the one or more photovoltaic cells.

14. The building integrable photovoltaic module of claim 1, wherein the second connector body is attached to the support sheet using a second arm.

15. The building integrable photovoltaic module of claim 14, wherein the second arm is sufficiently flexible to allow the second connector body to move at least about 1 millimeter with respect to the support sheet in a direction parallel to a length of the second arm, while maintaining the electrical connection between building integrable photovoltaic module and the second adjacent building integrable photovoltaic module.

16. The building integrable photovoltaic module of claim 14, wherein the second arm is sufficiently flexible to allow the second connector body to move by at least about 1 millimeter with respect to the support sheet in a direction perpendicular to a length of the second arm and parallel to the planar surface, while maintaining the electrical connection between building integrable photovoltaic module and the second adjacent building integrable photovoltaic module.

17. A method for installing a photovoltaic array, the method comprising (a) providing a first building integrable photovoltaic module positioned on a building structure, the first building integrable photovoltaic module comprising a first connector having a first connector body and a first arm, the first arm mechanically connecting the first connector body to a first support sheet, the first connector body movable with respect to the first support sheet at least in a direction perpendicular to a planar surface of the first support sheet, the first connector body comprising a first conductive element electrically coupled to a first set of photovoltaic cells; and (b) providing a second building integrable photovoltaic module comprising a second connector comprising a second connector body attached to a second support sheet, the second connector body comprising a second conductive element electrically coupled to a second set of photovoltaic cells; and (c) positioning the first connector body over the second connector body to form an electrical connection between the first conductive element and the second conductive element.

18. The method of claim 17, wherein the first building integrable photovoltaic module is movable with respect to the second building integrable photovoltaic module in one or more direction parallel to the planar surface of the first support sheet without interfering with the electrical connection between the first conductive element and the second conductive element.

19. The method of claim 17, further comprising dispensing a sealing material and/or an adhesive material between the first connector body and the second connector body prior to positioning the first connector body over the second connector body.

20. The method of claim 17, further comprising attaching the first support sheet and/or the second support sheet to the building structure.

* * * * *